(12) United States Patent
Croce et al.

(10) Patent No.: US 12,044,702 B2
(45) Date of Patent: Jul. 23, 2024

(54) CONTACT SOCKET MODULE AND METHOD OF TESTING ELECTRONIC COMPONENTS USING A CONTACT SOCKET MODULE

(71) Applicant: Cohu GmbH, Kolbermoor (DE)

(72) Inventors: Karl Croce, Inzell (DE); Markus Wagner, Kolbermoor (DE)

(73) Assignee: COHU GMBH, Kolbermoor (DE)

( * ) Notice: Subject to any disclaimer, the term of this patent is extended or adjusted under 35 U.S.C. 154(b) by 103 days.

(21) Appl. No.: 17/844,540

(22) Filed: Jun. 20, 2022

(65) Prior Publication Data

US 2023/0022960 A1 Jan. 26, 2023

(30) Foreign Application Priority Data

Jul. 16, 2021 (EP) .................................. 21186051

(51) Int. Cl.
| | |
|---|---|
| *G01R 1/04* | (2006.01) |
| *H01R 13/637* | (2006.01) |
| *H01R 33/76* | (2006.01) |
| *H01R 33/94* | (2006.01) |

(52) U.S. Cl.
CPC ......... *G01R 1/0425* (2013.01); *H01R 13/637* (2013.01); *H01R 33/7685* (2013.01); *H01R 33/94* (2013.01); *H01R 2201/20* (2013.01)

(58) Field of Classification Search
CPC .............. G01R 1/0425; G01R 31/2834; G01R 31/2808; G01R 31/2887; G01R 31/2889; H01R 13/637; H01R 33/7685; H01R 33/94; H01R 2201/20

USPC ....................... 324/756.02, 756.01, 537, 500
See application file for complete search history.

(56) References Cited

U.S. PATENT DOCUMENTS

| | | |
|---|---|---|
| 5,146,780 A | 9/1992 | Zuckerwar et al. |
| 9,560,462 B2 | 1/2017 | Eriksen et al. |
| 9,992,592 B1 | 6/2018 | Alam et al. |
| 2008/0265924 A1 | 10/2008 | Barabi et al. |
| 2009/0102457 A1 | 4/2009 | Vayner et al. |
| 2010/0290634 A1 | 11/2010 | Schaule et al. |
| 2014/0328489 A1 | 11/2014 | Ziegler et al. |
| 2018/0213340 A1 | 7/2018 | Perrin et al. |
| 2019/0045284 A1 | 2/2019 | Fallon |

(Continued)

FOREIGN PATENT DOCUMENTS

| | | |
|---|---|---|
| CN | 102711029 | 10/2012 |
| CN | 106124025 | 11/2016 |

(Continued)

*Primary Examiner* — Giovanni Astacio-Oquendo
(74) *Attorney, Agent, or Firm* — Knobbe, Martens, Olson & Bear, LLP

(57) ABSTRACT

A contact socket module for use in an automated test equipment (ATE) for testing electronic components (DUTs) being carried by a carrier comprises: a plurality of groups of spring contacts, wherein each spring contact comprises a DUT sided contact tip, a retracting plate being moveable, and a controller controlling the movement of the retracting plate, wherein the retracting plate and the spring contacts act mechanically on each other. In a first position the DUT sided contact tips are adapted to contact to contact portions of the electronic components, and in a second position, the DUT sided contact tips are adapted to release the contact to the contact portions of the electronic components.

18 Claims, 6 Drawing Sheets

(56) References Cited

U.S. PATENT DOCUMENTS

| | | | |
|---|---|---|---|
| 2019/0346336 A1 | 11/2019 | Regef | |
| 2020/0300890 A1 | 9/2020 | Kawashima et al. | |
| 2022/0082613 A1* | 3/2022 | Kato | G01R 31/2868 |
| 2022/0206041 A1* | 6/2022 | Hwang | G01R 1/07314 |
| 2023/0393188 A1* | 12/2023 | Cruzan | G01R 31/2893 |

FOREIGN PATENT DOCUMENTS

| | | |
|---|---|---|
| CN | 107205206 | 9/2017 |
| CN | 109391893 | 2/2019 |
| CN | 109672969 | 4/2019 |
| DE | 10 2008 015 916 A1 | 10/2009 |
| DE | 10 2018 102 096 A1 | 8/2019 |

* cited by examiner

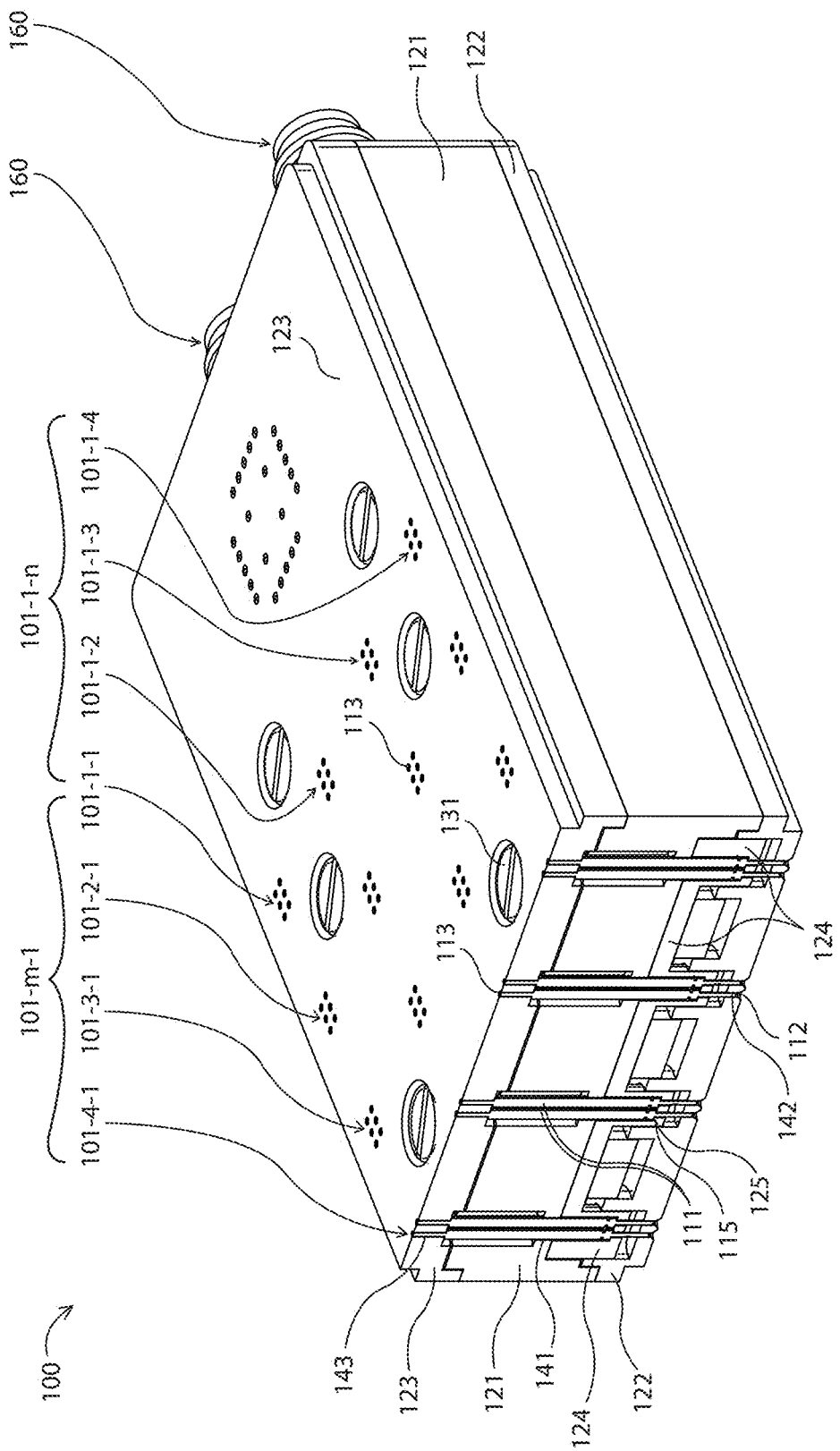

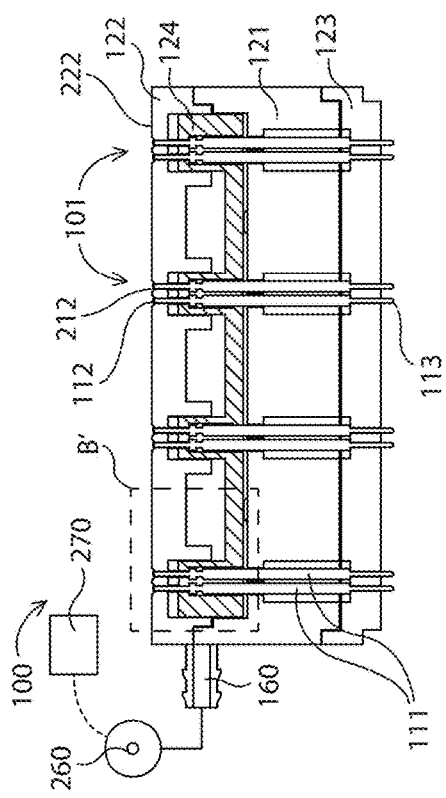
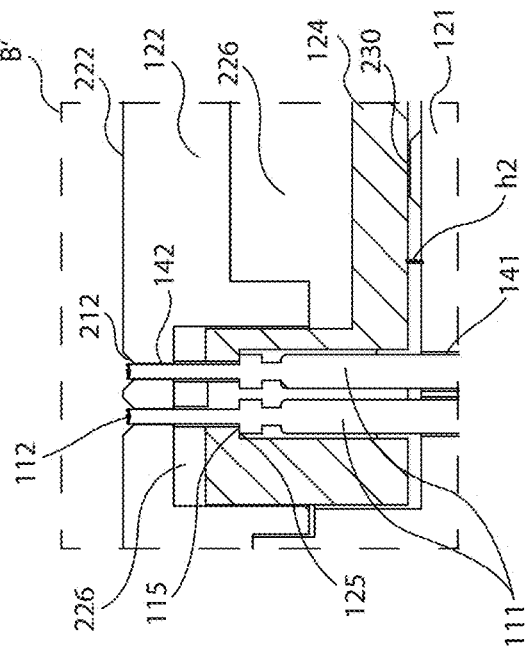
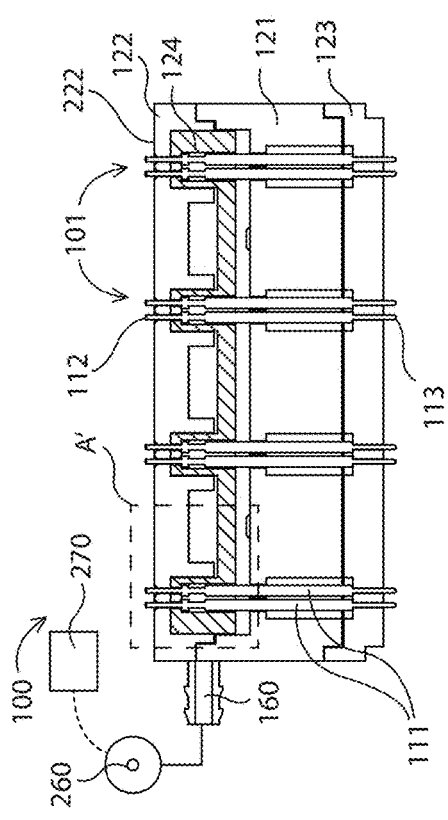
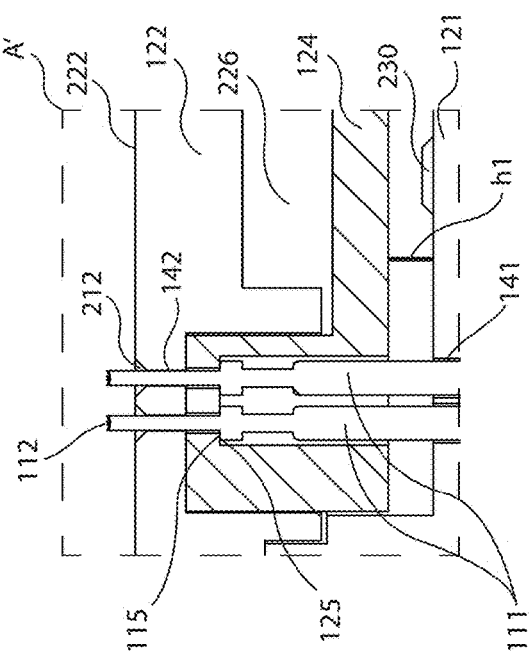

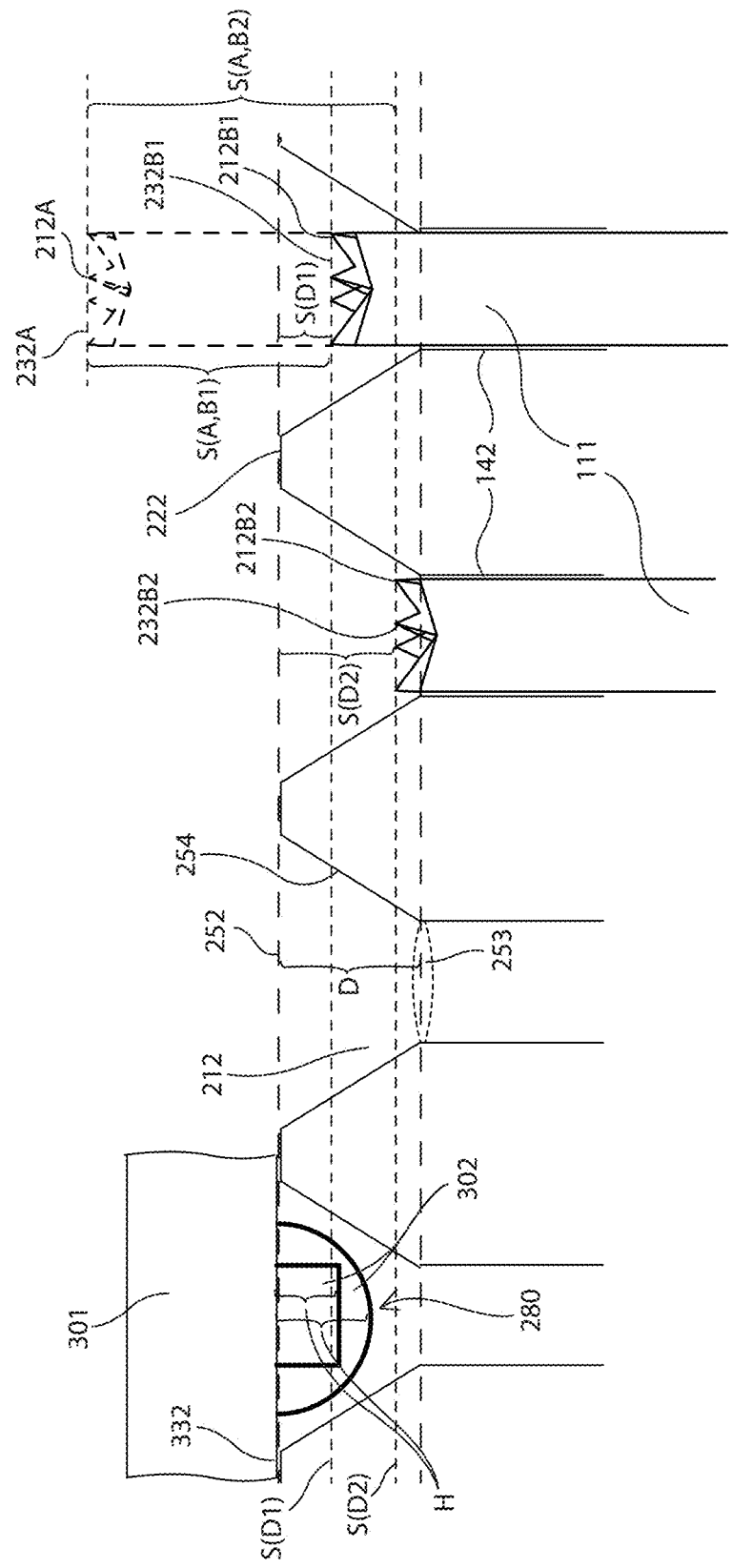

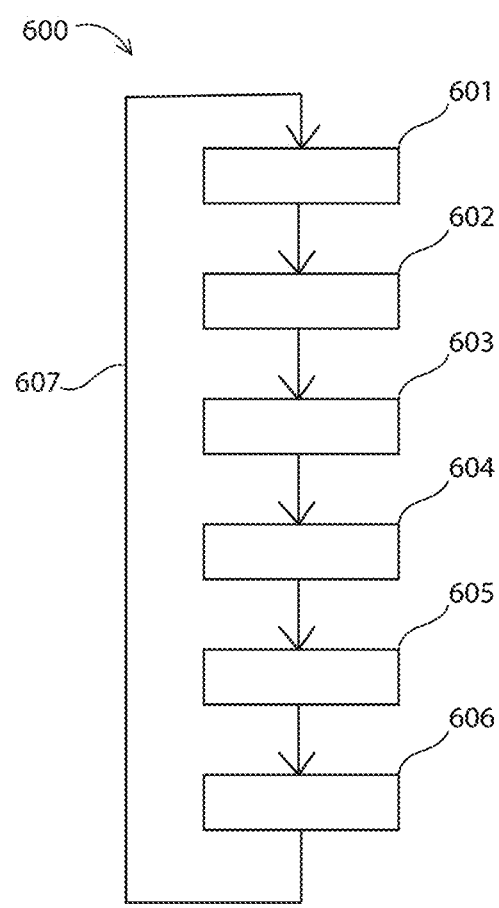

CONTACT SOCKET MODULE AND METHOD OF TESTING ELECTRONIC COMPONENTS USING A CONTACT SOCKET MODULE

This application claims the benefit of the filing date of European Patent Application No. 21 186 051.5 filed Jul. 16, 2021, the disclosure of which is hereby incorporated herein by reference.

DESCRIPTION

Field of the Invention

The invention is related to a contact socket module and method of testing electronic components using a contact socket module.

Automated test equipment is widely used for testing semiconductor devices, electronic components, or so called DUTs (device under test). Carriers carrying a plurality of DUTs provide highly efficient and fast parallel testing. However, sometimes jams occur reducing the outcome negatively. On the other hand, speed of testing is often in contradiction to prioritizing of jam prevention.

Description of the Invention

There may be a need to increase the efficiency of testing of electronic components using carriers.

According to an exemplary embodiment of the invention a contact socket module for use in an automated test equipment (ATE) for testing electronic components DUTs being carried by a carrier comprises:

a plurality of groups of spring contacts, wherein each spring contact comprises a DUT sided contact tip,
a retracting plate being moveable, and a controller controlling the movement of the retracting plate, wherein the retracting plate acts mechanically on the spring contacts, so that
in a test position the retracting plate is in a first position and the DUT sided contact tips are adapted to contact to contact portions of the electronic components in the first position of the retracting plate, and
the retracting plate is in a second position, when the DUT sided contact tips are adapted to releasing the contact with the contact portions of the electronic components, and wherein
the controller controls a movement of the retracting plate from the first position into the second position, and back from the second position into the first position.

According to an exemplary embodiment of the invention a method of testing electronic components (DUTs) with a contact socket module in an automated test equipment (ATE), wherein the contact socket module comprises a plurality of groups of spring contacts, wherein each spring contact comprises a at least one DUT sided contact tip, a retracting plate being moveable, wherein the retracting plate acts mechanically on the spring contacts, and a controller, the method comprising:

Controlling a movement of the retracting plate by the controller, wherein the controller controls the movement of the retracting plate from a first position into a second position, and back from the second position into the first position,
Testing the electronic components (DUTs) when the retracting plate is in the first position where the DUT sided contact tips are adapted to contact to contact portions of the electronic components, wherein
Controlling the movement of the retracting plate into the second position, when the DUT sided contact tips are adapted to releasing the contact with the contact portions of the electronic components.

The expression "automated test equipment (ATE)" may denote a system typically including a handler, and a tester for testing electronic components (DUTs), or particularly semiconductor devices. The expression "contact socket module" may refer to an independently exchangeable unit within an automated test equipment, and, in particular within a handler. The contact socket module may comprise a plurality of contact sites, wherein each one of the contact sites is adapted to test one DUT at a time. The term "carrier" may refer to a device that carries a plurality of electronic components (DUTs), the carrier may be used to convey the plurality of electronic components to different positions within the handler. The carrier may also be called "batch carrier" and may, in particular be of the type of a vacuum carrier where vacuum is used to hold the electronic components on the carrier. The expression "spring contact" may refer to an elastic body or device used in an ATE which recovers its original shape when released after being distorted. The spring contact may be distorted when contacting to a DUT and may recover its original shape when the DUT is removed. The expression "spring contact" may, in particular, refer to so called pogo pins or pin contacts. However, the expression "spring contact" may also refer to so called cantilever contacts. The term "contact" (or "contacting") may here refer to a temporary junction through which an electrical current may flow. The expression "DUT sided contact tip" may refer to a pointed end of the spring contact. The expression "retracting plate" may refer to a moveable flat piece of material which, in particular may be drawn or pulled back from one position to another position. In particular, by moving the retracting plate, also the DUT sided contact tips may be forced to a movement backwards, and also in this sense may be retracted. The term "controller", or synonymously "control unit" may refer to a device causing an action or operating mechanism, that is, in particular, a device causing the movement of the retracting plate. The expression "mechanically act" may refer to mechanically acting upon one another, including directly and indirectly. I.e., the retracting plate and the DUT sided contact tips may interlock so that a movement of the retracting plate causes a movement of the DUT sided contact tips. The expression "test position" may refer to a position of the carrier within the handler wherein the DUTs on the carrier can contact to the DUT sided contact tips. The expression "first position" and "second position" may refer to different positions of the retracting plate. In the first position of the retracting plate a test of the DUTs may be executed, and in the second position a test may not be executed with retracted DUT sided contact tips. The expression "contact portions of the electronic components" may refer to any type of electrical contacts used to mount electronic components on a PCB. In particular, the contact portions may be so called "solder balls" of an electronic component having the package as a BGA (ball grid array) or "BGA chip". The contact portions may alternatively have the shape of so called "pads". The expression "releasing the contact" may refer to successively or continuously loosening the mechanical contact. A mechanical process where the DUT sided contact tips may be continuously separated from the contact portions of the electronic components disregarding which package the electronic component may happen while releasing the contact.

According to a gist of the invention a controller controls independently a movement of the DUT sided contact tips, wherein the movement is independent of a placement of the DUTs on the DUT sided contact tips, i.e. the movement is independent of the DUTs being in test position or not. The invention is hereby based on the finding that even if, on the one hand, it takes additional time and effort to control the movement of the DUT sided contact tips independently from a placement of the DUTs, on the other hand, this may reduce jams on test sites and may thus enhance an efficiency of the entire ATE. Therefore, a reduction in speed and higher complexity of the handler may, here, result in an unexpected way to enhancing the overall efficiency, i.e. the result may be a higher output of correctly tested DUTs.

If the retracting plate is in the first position this may be equal to a first state of the contact socket module. There is the plurality of groups of spring contacts terminating in the DUT sided contact tips and towards the DUTs or, in particular, the contact portions of the DUTs, which may be solder balls of a BGA chip or other pads. Each one of the groups of the DUT sided contact tips representing one contact site may establish an electrical contact to one DUT. If a so called "Kelvin contact" is required then even two DUT sided contact tips may contact to one contact portion of each of the DUTs. The retracting plate may interlock with each of the DUT sided contact tips of the plurality of spring contacts, so that a movement of the retracting plate into the second position moves and retracts each of the DUT sided contact tips, respectively.

When retracting the DUT sided contact tips a force between the DUT sided contact tips and the contact portions may be reduced. The contact socket module is adapted to control the movement of the retracting plate so that the DUT sided contact tips are successively and continuously release the contact towards the contact portions of the electronic components in the second position of the retracting plate. In detail, a given height H of the contact portions, and a retracting depth $S(D1)$ of at least one of the contact tips into the second position relative to a level of a cover plate surface of a cover plate may define a relation between $S(D1)$ and H, wherein even $S(D1)<H$ (FIG. 2C).

On one side of the contact socket module the DUT sided contact tips extend out of a DUT sided cover plate and on the opposite side of the contact socket module PCB sided contact tips of the spring contacts extend out of a PCB sided cover plate. While the retracting plate and the DUT sided contact tips are movable relative to a main body of the contact socket module, the DUT sided cover plate and the PCB sided cover plate remain fixed relative to the main body.

Aspects of the invention are as follows:

According to an exemplary embodiment the contact socket module is adapted so that while the electronic components (DUTs) are in the test position, the controller controls the movement of the retracting plate from the first position into the second position.

The expression "the controller controls the movement of the retracting plate" may refer to the controller causing directly or indirectly a movement of the retracting plate. The movement of the retracting plate from the first position into the second position which equals retracting back the DUT sided contact tips is caused by the controller while the electronic components or DUTs are still in a test position on the contact socket module.

According to an exemplary embodiment is the contact socket module adapted to lift off the DUT sided contact tips from the contact portions in the second position of the retracting plate.

When retracting the DUT sided contact tips the distance equalling the amount of movement of the retracting plate may be sufficient to lift off the DUT sided contact tips from the contact portions. The contact socket module is adapted to control the movement of the retracting plate so that the DUT sided contact tips are lift off from the contact portions of the electronic components in the second position of the retracting plate. In detail, a given height H of the contact portions, and a retracting depth $S(D2)$ of at least one of the contact tips into the second position relative to a level of a cover plate surface of a cover plate may define a relation between $S(D2)$ and H, wherein $S(D2)>H$ (see FIG. 2C). The expression "cover plate surface" may refer to a surface where the DUTs are positioned on in order to contact to the contact tips of the contact socket module. On one side of the contact socket module there may be a DUT sided cover plate, and the cover plate surface may be the surface of the DUT sided cover plate. On the opposite of the DUT sided cover plate, the main plane of the contact socket module may have a PCB sided cover plate, which side of the spring contacts couple to a PCB and finally indirectly to a tester. The expression "height H" of the contact portions may refer to a value in a length measure to which the contact portions extend out of a main plain of the electronic component, or DUT. The DUTs may be placed with the contact side on the cover plate and the contact portions may extend to a certain amount into the cover plate surface. The amount to which the contact portions extend into the cover plate surface may be equal to the height of the contact portions if the DUTs are positioned directly on the cover plate without any gap. The expression "retracting depth" may refer to a depth to a value in length measure to which the contact sided tips are retracted into the cover plate in the second position of the retracting plate. As a consequence, the contact sided tips may be lifted off the contact portions in the second position of the retracting plate.

According to an exemplary embodiment of the contact socket module comprises the retracting plate receiving surfaces, and the spring contacts comprise abutting faces, and the receiving surfaces and the abutting faces interlock with each other, so that, in the first position, the retracting plate lightly pre-loads the spring contacts, and, in the second position, the retracting plate stronger stresses the spring contacts.

The expression "receiving surfaces" may refer to a surface of the retracting plate which acts as a surface of any shape to support the weight or pressure of a counterpart. The expression "abutting faces" may refer to a surface of any shape of each of the spring contacts to which the receiving surface of the retracting plate is juxtaposed. The receiving surfaces of the retracting plate may bear the abutting face of the spring contacts and in this sense the spring contacts and the receiving surface may interlock with each other. The expression "lightly pre-loads" may refer to a state where the spring contacts are slightly stressed with a small force in contrast to the expression "stronger stresses" which may refer to a heavier force compared to the light pre-load of the spring contacts. A stronger stress may compress the spring contacts more than lightly pre-loading the spring contacts. Further, the light pre-load of the spring contacts may be optimized for contacting to the electronic component, and in particular to a contact portion of the electronic component.

The receiving surface may comprise a circular opening, and the abutting face may be annular, so that the circular opening of the receiving surface encircles the annular abutting face. The receiving surface of the retracting plate may move the DUT sided contact tips and may also guide this movement to be perpendicular relative to a main plain of the contact socket module and in parallel to a contacting movement of the electronic components when being placed on the contact socket module by the carrier.

According to an exemplary embodiment the contact socket module further comprises an elevated abutting face extending opposite to the movement of the retracting plate from the first position into the second position, so that the elevated abutting face limits the movement of the retracting plate from the first position into the second position.

The expression "elevated abutting face" may refer to a higher front surface inside the contact socket module to which the retracting plate may terminate as a limiting contact. There may be two spaces: A first space may be located between the DUT sided cover plate and the retracting plate. The second space may extend between the retracting plate and the base body of the contact socket module. The movement of the retracting plate from the first position into the second position may be driven by applying air pressure to the first space. The movement of the retracting plate from the first position to the second position may reduce the size of the second space wherein the retracting movement is limited by the elevated abutting face.

According to an exemplary embodiment of the contact socket module, each one of the plurality of groups of spring contacts form a contact site being adapted to contact to one electronic component (DUTs) on the carrier, at a time.

The groups of spring contacts may be arranged in a m×n-matrix wherein the pitches between the spring contacts are equal to the pitches of the contact portions or solder balls of the DUTs.

According to an exemplary embodiment the contact socket module, each of the DUT sided contact tips is located central within one recess, wherein the DUT sided contact tip extends into the respective recess in the first position of the retracting plate, and wherein the DUT sided contact tip is retracted from the recess in the second position of the retracting plate.

The term "recess" may refer to an indentation in a surface. In the test position the contact portions of the electronic components may rest in recesses of DUT sided cover plate and the DUT sided contact tips may be located centrally in recesses and extend into the recesses, so that the DUT sided contact tips are adapted to contact to the contact portions of the electronic components.

According to an exemplary embodiment the contact socket module further comprises a pump controlled by the controller, the pump providing air pressure on the retracting plate in its second position.

The term "pump" may refer to a device that delivers and/or or compresses a fluid, in particular air which may be pressed towards the retracting plate. The controller may cause the pump to start the process of pumping or compressing and transferring pressurized air towards the retracting plate. The pump may provide pressurized air to move the retracting plate against the mutual force of the pre-loaded spring contacts.

The controller may further control a valve, so that after the retracting plate is in the second position the air pressure is reduced and the combined force of the spring contacts pushes the retracting plate back to its first position.

According to an exemplary embodiment the automated test equipment comprises a contactor and at least two contact socket modules (for example contact modules according to the invention as described above), wherein the at least two contact socket modules are arranged parallel to each other in a main plane of the contactor, so that the at least two contact socket modules are adapted to contact to at least two times of the number of electronic components simultaneously.

The contactor in the handler may provide a plurality of contact socket modules so that the number of electronic components which can be tested simultaneously may be multiplied. In particular, the number of the test sockets or groups of spring contacts of each contact socket module multiplied by the number of the contact socket modules of each contactor may be equal to the number of DUTs being carried by the carrier.

According to an exemplary embodiment the automated test equipment further comprises a vacuum source for providing vacuum to the carrier, wherein the carrier is adapted to continuously hold the electronic components by vacuum suction for a period of time while the vacuum is provided for a shorter period of time.

According to an exemplary embodiment the method further comprises:
 Controlling the movement of the retracting plate by the controller from the first position into the second position, while the electronic components DUTs are in the test position.

The movement of the retracting plate from the first position into the second position may result in continuously disconnecting the DUT sided contact tips from the contact portions of the electronic components. As a consequence, the DUT sided contact tips become eventually free of being adapted to contact to the contact portions of the electronic components.

According to an exemplary embodiment the method further comprises:
 Lifting off the DUT sided contact tips from the contact portions in the second position of the retracting plate.

According to an exemplary embodiment of the method, the retracting plate comprises receiving surfaces, and the spring contacts comprise abutting faces, wherein the receiving surfaces and the abutting faces interlock with each other, and the method further comprises:
 Lightly pre-loading the spring contacts in the first position of the retracting plate, and,
 Stronger stressing the spring contacts in the second position of the retracting plate.

According to an exemplary embodiment the method, the contact module further comprises an elevated abutting face extending opposite to the movement of the retracting plate from the first position into the second position, and the method further comprises:
 Limiting the movement of the retracting plate from the first position into the second position by the elevated abutting face.

According to an exemplary embodiment the method further comprises forming a contact site with each one of the plurality of groups of spring contacts, and
 Contacting with one contact site to one electronic component DUTs on the carrier, at a time.

According to an exemplary embodiment of the method, the contact module further comprises recesses, wherein the DUT sided contact tips are located central within the recesses, wherein the method further comprises:

Letting extend the DUT sided contact tips into the recesses in the first position of the retracting plate, and wherein Retracting the DUT sided contact tips from the recesses by moving the retracting plate into the second position.

According to an exemplary embodiment of the method, the contact module further comprises a pump, and the method comprises:

Controlling the movement of the retracting plate by providing air pressure from the pump.

According to an exemplary embodiment of the method, comprises the automated test equipment (ATE) a contactor and at least two contact socket modules, wherein the at least two contact socket modules are arranged parallel to each other in a main plane of the contactor, and the method comprises:

Simultaneously contacting the at least two contact socket modules to the at least two times of the number of electronic components.

According to an exemplary embodiment of the method, comprises the automated test equipment (ATE) a vacuum source, and the method further comprises:

Continuously holding the electronic components by vacuum suction for a period of time by providing vacuum to the carrier for a shorter period time.

It has to be noted that embodiments of the invention have been described with reference to different subject matters. In particular, some embodiments have been described with reference to apparatus type claims whereas other embodiments have been described with reference to method type claims. However, a person skilled in the art will gather from the above and the following description that, unless other notified, in addition to any combination of features belonging to one type of subject matter also any combination between features relating to different subject matters, in particular between features of the apparatus type claims and features of the method type claims is considered as to be disclosed with this application.

Further embodiments of the invention are disclosed in the appending figures. The invention will be described in more detail hereinafter with reference to examples of embodiment but to which the invention is not limited.

BRIEF DESCRIPTION OF THE DRAWINGS

FIG. 1 is a perspective and cross-sectional view of a contact socket module

FIG. 2A is a cross-sectional and schematic view of a contact socket module in a first state FIG. 2A' shows a detail of the contact socket module in the first state FIG. 2B is a cross-sectional and schematic view of the contact socket module in a second state FIG. 2B' shows a detail of the contact socket module in the second state FIG. 2C depicts in a detailed cross-sectional view the relations between movements of the contact tips FIG. 6 shows a flow diagram of a method for testing electronic components using a contact socket module

DETAILED DESCRIPTION OF THE DRAWING

Figure 3A:
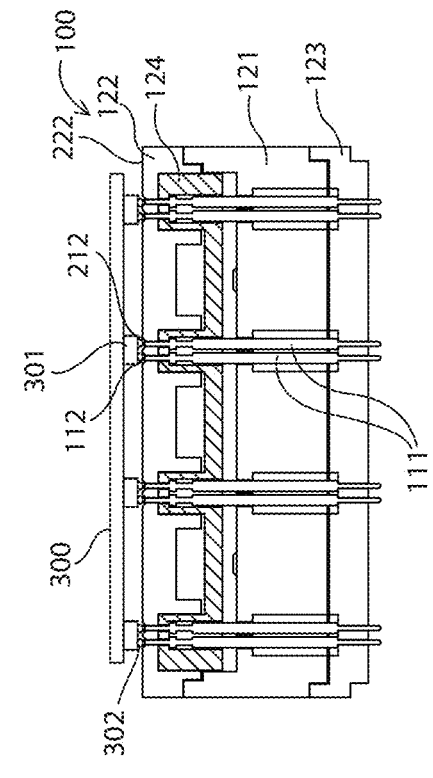
FIG. 3A shows a contact socket module in a first state before receiving a batch carrier with carried DUTs

The illustrations in the drawings are schematic. It is noted that in different figures similar or identical elements are provided with the same reference signs.

It should be noted that the term "comprising" does not exclude other elements or steps and "a" or "an" does not exclude a plurality. Also elements described in association with different embodiments may be combined. It should also be noted that reference signs in the claims should not be construed as limiting the scope of the claims.

FIG. 1 shows a contact socket module 100 in a perspective and cross-sectional view. The contact socket module 100 comprises an m×n-matrix 101-$m$-$n$ of 16 contact sites 101-1-1 to 101-4-4 (101-4-4 not shown), where m=4 and n=4. That is, the m×n-matrix 101-$m$-$n$ comprises 4 rows 101-$m$-1 (for m=1 to 4) and 4 columns 101-1-$n$ (for n=1 to 4) of 4 contact sites 101-1-1 to 101-4-4, respectively. The first row 101-1-1 to 101-1-4 comprises 4 contact sites, as well the second to fourth rows. Similarly, the first column 101-1-1 to 101-4-1 first column of 4 contact sites, as well as the second to fourth columns. Each of the contact sites 101 comprises at least one, or usually a plurality of spring contacts 111.

The contact socket module 100, further comprises a base body 121, a DUT sided cover plate 122, and a PCB sided cover plate 123. The DUT sided cover plate 122 faces towards the DUTs, the PCB sided cover plate 123 faces towards a PCB (see FIG. 5, 504), and the base body 121 is arranged between the DUT sided cover plate 122 and the PCB sided cover plate 123. The plurality of spring contacts 111 are arranged to extend perpendicularly through the base body 121, the DUT sided cover plate 122, and the PCB sided cover plate 123.

With a DUT sided contact tip 112, each of the spring contacts 111 penetrates through the DUT sided cover plate 122. On the opposite side of the contact socket module 100, each of the spring contacts 111 comprises a tester sided contact tip 113 extending through the PCB sided cover plate 123. Base slots 141 within the base body 121 may hold the spring contacts 111. The DUT sided cover plate 122, and the PCB sided cover plate 123 may comprise tip guides 142, 143, to guide a movement of the DUT sided contact tips 112, and the tester sided contact tip 113, respectively.

A group of at least one, or usually more spring contacts 111 forming one contact site 101 may be adapted to contact to one DUT. Accordingly, a group of at least one or more DUT sided contact tips 112 may be adapted to contact to one DUT, and the number of DUT sided contact tips 112 may be identical with the respective number of PCB sided contact tips 113 (contacting to a PCB, FIG. 5, 504), and identical with the number of spring contacts 111.

Further, the contact socket module 100 comprises a pneumatic connection 160, and a retracting plate 124 arranged between the base body 121 and the DUT sided cover plate 122. The retracting plate 124 may movable from the DUT sided cover plate 122 back towards the base body 121. Each spring contact 111 may comprise an annular abutting face 115 engaging with a receiving surface 125 of the retracting plate 124, so that the back-movement of the retracting plate 124 being caused by the pneumatic connection 160 may cause a retracting movement of the DUT sided contact tips 112 relative to the DUT sided cover plate 122 (which will be described in more detail with FIGS. 2A, 2A', 2B, 2B', 2C).

The spring contacts 111 may be pre-loaded between the receiving surface 125 of the retracting plate 124 and the PCB sided cover plate 123, so that the DUT sided contact tips 112 extend outwards from the DUT sided cover plate 122, and the PCB sided contact tips 113 extend outwards from the PCB sided cover plate 123. The contact socket module 100 may further comprise screws 131 in order to fix the DUT sided cover plate 122 and the PCB sided cover plate 123 to each other, while the pre-loaded spring contacts 111 are held in between the DUT sided cover plate 122 and the PCB sided cover plate 123.

FIG. 2A shows a cross-sectional view of a contact socket module 100 in a first state, and depicts schematically a pneumatic and/or an air pressure connection 160. In the first state of the contact socket module 100, the spring contacts 111 are pre-loaded and exert a force outwardly, so that the DUT sided contact tips 112 extend beyond a cover plate surface 222 of the DUT sided cover plate 122. Analogously, the tester sided contact tips 113 extend beyond the PCB sided cover plate 123. A perpendicular movement of the DUT sided contact tips 112 is determined and limited by interlocking with the retracting plate 124, which will be shown and described in detail A' with FIG. 2A'.

The pneumatic connection 160 is coupled to a pump 260 providing air pressure and a controller 270 may activate the pump 260. As a consequence, an activation of the pneumatic connection 160 is independent of actually contacting (or testing of) the DUTs.

In FIG. 2A' the detail A' of the contact socket module 100 shows that the (annular) abutting face 115 of the contact spring 111, and the (circular) receiving surface 125 of the retracting plate 124 abut on each other and as a result limit the movement of the DUT sided contact tips 112 outwards. In this sense, the DUT sided contact tip 112 and the retracting plate 124 are interlocked, so that a back-movement of the retracting plate 124 into a second position within the contact socket module 100 causes the DUT sided contact tips 112 to move back as well into a second position. The second position of the retracting plate 124 and of the DUT sided contact tips 112 may define the second state of the contact socket module 100. Analogously, may the first position of the retracting plate 124 and of the DUT sided contact tips 112 define the first state of the contact socket module 100.

However, in the first state, the DUT sided contact tips 112 extend outwards beyond the cover plate surface 222 of the DUT sided cover plate 122. The surface 222 of the DUT sided cover plate 122 may comprise recesses 212 being adapted to receive solder balls of electronic components to be tested. For this purpose, the recesses 212 extend circumferentially around the DUT sided contact tips 112 lying central in the recesses 212. Further, tip guides 142 of the DUT sided cover plate 122 and base slots 141 of the base body 121 limit the movement of the spring contacts 111 towards a perpendicular movement relative to a main plain of the contact socket module 100, wherein the main plane may be defined by the main planes of the DUT sided cover plate 122 and of the PCB sided cover plate 123. In the first state the movement of the retracting plate 124 is limited by abutting on the DUT sided cover plate 122, so that a distance h1 between the retracting plate 124 and an elevated abutting face 230 of the base body 121 is maximal. A space 226 between the retracting plate 124 and the DUT sided cover plate 122, on the other side, is minimal. Hence, the pre-loaded DUT sided contact spring tips 112 extend outwards the DUT sided cover plate surface 222 of the DUT sided cover plate 122 in the first state of the contact socket module 100.

FIG. 2B is a similar cross-sectional view of the contact socket module 100 as shown with FIG. 2A only differing in that the contact socket module 100 is now in a second state. In the second state, the controller 270 has activated the pump 260 and as a consequence air pressure is applied to the pneumatic connection 160. Therefore, the DUT sided contact tips 112 are retracted into the recesses 212 of the DUT sided cover plate 122 in the second state of the contact socket module 100 or second position of the retracting plate 124, respectively.

In more detail, FIG. 2B' shows that the DUT sided contact tips 112 lie central within in the recesses 212 and therefore do not extend beyond the cover plate surface 222 of the DUT sided cover plate 122. The annular abutting face 115 of the spring contacts 111, and the circular receiving surface 125 of the retracting plate 124 abut on each other and with the movement of the retracting plate 124 into the second state, the DUT sided contact tips 112 are pushed back into the recesses 212. The second state of the contact socket module 100 is consequently achieved by a movement of the retracting plate 124 into the second position which causes a movement of the DUT sided contact tips 112 back into the recesses 212. Simultaneously, the space 226 between the retracting plate 124 and the DUT sided cover plate 122 is maximized and the distance h2 between the retracting plate 124 and the base body 121 is minimal and only limited by the elevated abutting face 230 to which the retracting plate 124 abuts.

FIG. 2C shows in more detail different positions of the contact tips, where a distance or height between a level 232A of the contact tip in the first position 212A relative to a retracting level 232B1, or 232B2 of the contact tip in the second, retracted position 212B1, or 212B2, respectively, may define a displacement height S (A, B1), or S (A, B2). However, the displacement height S (A, B1), or S (A, B2) may mainly depend on a spring back force of the spring contacts 111 and a required contact force to contact to contact portions 302 of a DUT 300 in order to provide sufficient electrical contact in the first position.

Further, the retracting levels 232B1, and 232B2 may define retracting depths S(D1), or S(D2), relative to a cover plate level 252 of the cover plate surface 222. A recess depth D between the cover plate level 252 and a level 253 of a recess bottom may help to define a relation R(D)=S(D)/D wherein this recess depth relation R(D) may have a value of 1.01 to 2 (or more). However, it may be difficult to derive proper retracting depths S(D1), or S(D2), only based on the recesses 212 alone. The recess 212 may vary in its size and shape, and, for example, a slant 254 of the recess 212 may vary widely in its inclination (angle), where the slant 254 could even be perpendicular relative to the cover plate surface 222 if a size of the contact tips 212 has a similar and only slightly smaller size than the contact portions 302 of the DUT 300.

In addition, a height H of the contact portion 302 may vary depending whether contact portion 302 is a solder ball or any other kind of pad. Referring to the height H of the contact portion 302 there may be a relation between H and the retracting depth S(D2), so that S(D2)>H. In this case, the DUT sided contact tip 232B2 is lift off the contact portion 302 of the electronic component 301 and there is a gap 280 between the DUT sided contact tip 232B2 in the second position and the contact portion 302. However, an effect of avoiding jams may already been achieved when releasing the DUT sided contact tip 232B1 from the contact portion 302, so that, in this case, the retracting depth S(D1) may be slightly smaller than H, which is S(D1)<H. As a consequence, how far the contact tips 212B may be retracted into the recess 212 in order to reduce jams, may be already given with the retracting depth S(D1) reducing the force by which the DUT sided contact tip 212B is pushed towards and into the contact portion 302 of the electronic component 301. The retracting depths S(D1) and S(D2) may both support to removing the DUTs 301 held by the carrier 300 from the test position, even if the retracting depth S(D2), where there is the gap 280 between the DUT sided contact tip 212B1 and the contact portion 302 of the DUT 301 may sometimes be required.

FIG. 3A to FIG. 3D still refer to the first and the second state of the contact socket module 100 being described with the previous FIGS. 2A to 2B', and 2C. However, FIG. 3A to 3D include a section of a batch carrier 300 showing how a plurality of DUTs 301 contact to the groups of spring contacts 111.

In FIG. 3A, the contact socket module 100 is in the first state, where the DUT sided contact tips 112 extend—according to the first position—out of the cover plate surface 222 of the DUT sided cover plate 122. The section of a batch carrier 300 carries a plurality of DUTs 301 ready for contacting.

Figure 3B:
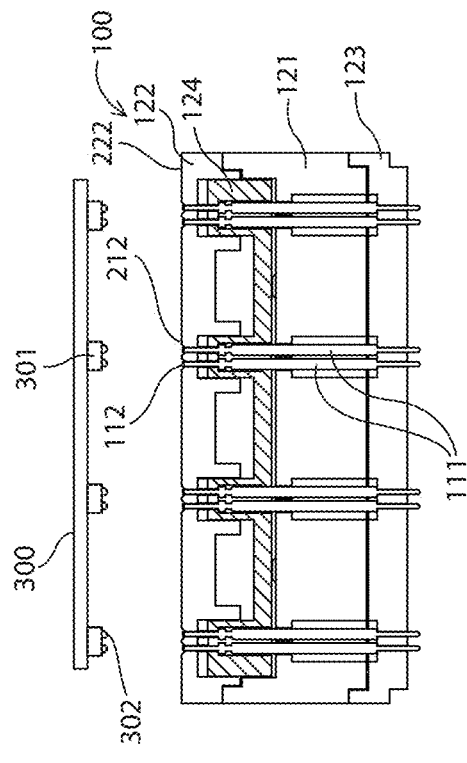
FIG. 3B shows the contact socket module in the first state when testing the DUTs on the batch carrier

In FIG. 3B, the contact socket module 100 is in the first state, the batch carrier 300 carrying the plurality of DUTs 301 is lowered towards the DUT sided cover plate 122, so that solder balls 302 of the DUTs 301 rest in the recesses 212 and as a consequence contact to the DUT sided contact tips 112 of the spring contacts 111. In the first state of the contact socket module 100 and with the solder balls 302 of the DUTs 301 resting in the recesses 212, the DUTs 302 are ready to be tested. Then, a test of the DUTs 301 is executed.

Figure 3C:
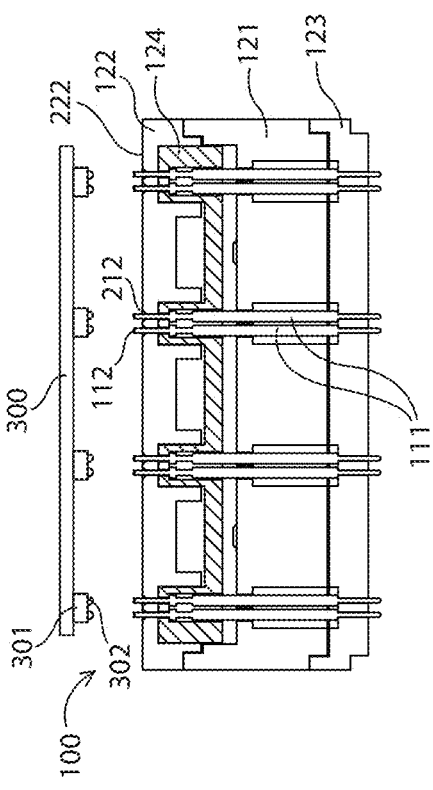
FIG. 3C shows the contact socket module in a second state after testing the DUTs on the batch carrier

In FIG. 3C, the batch carrier 300 is still in the position of possible testing lying on the DUT sided cover plate 122 with the solder balls 302 located in the recesses 212. However, the contact socket module 100 is in the second state, and the DUT sided contact tips 112 are retracted from a contact position and back into the recesses 212 into the second position, so that, while the batch carrier 300 is in "test position", the solder balls 302 are free of contacting to the DUT sided contact tips 112. There may be a gap 280 between the solder balls 302 and the DUT sided contact tips 112.

Figure 3D:
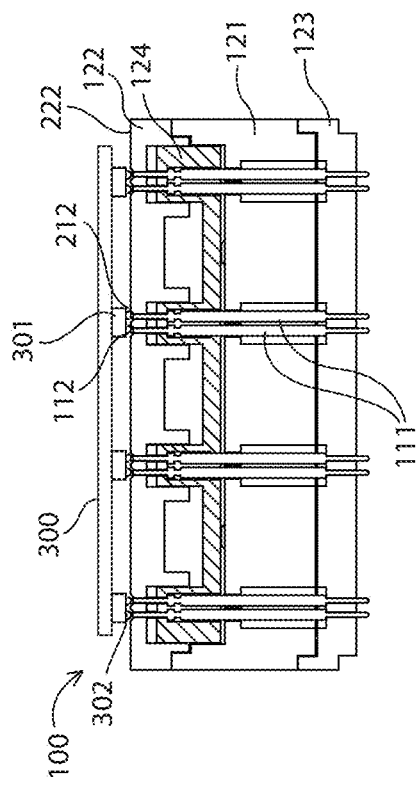
FIG. 3D shows the contact socket module in the second state after removing the batch carrier with the DUTs

Finally, in FIG. 3D the batch carrier 300 is removed from the position on the DUT sided cover plate 122 and the DUTs 301 are removed from the test position, as well as the solder balls 302 are removed from the recesses 212 of the DUT sided cover plate 122. After bringing the contact socket module 100 back into the first state, a new contact or test cycle may again start according to FIG. 3A.

Figure 4:
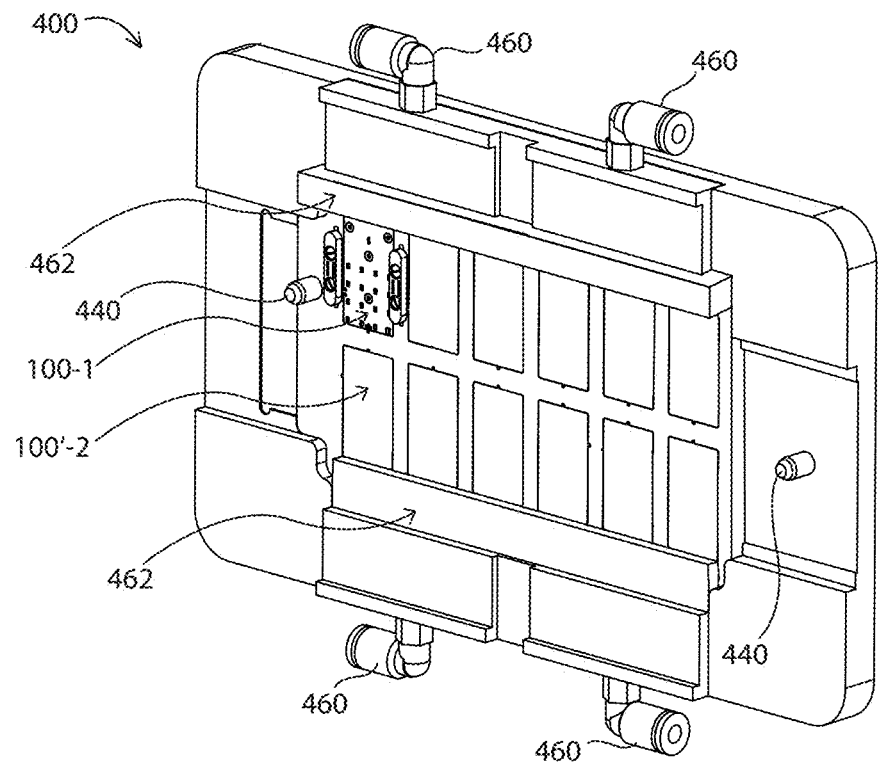
FIG. 4 shows a contactor in a perspective view

FIG. 4 shows a contactor 400 in a perspective view. The contactor 400 comprises a plurality of up to 12 contact socket modules 100-1 (only one shown) and the same number of receiving positions 100'-2 of up to twelve. The contactor 400 allows for processing and testing a plurality of electronic components simultaneously. The contactor 400 further comprises four pneumatic connections 460 and two manifolds 462 for supplying the air pressure towards each of the respective contact socket module 100-1 and as a consequence for actuating and moving the retracting plates 124 (see e.g. FIG. 2A, and FIG. 3A). Centring pins 440 may help to align the contactor 400 and the mounted contact socket modules 100-1 relative to the batch carrier (see FIG. 3A to 3C, or FIG. 5, 300) provided by a handler (see FIG. 5, 501).

Figure 5:
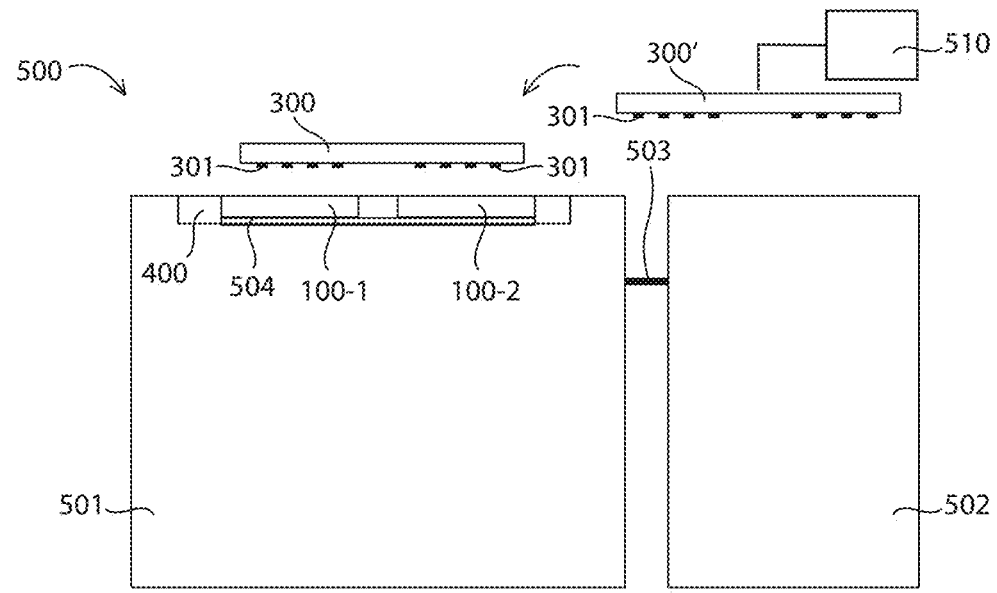
FIG. 5 is a schematic view of an automated test equipment (ATE) and a batch carrier

In FIG. 5 a schematic setup for an ATE (automated test equipment) 500 shows a handler 501, and a tester 502, both being coupled by a data cable 503. A (batch) carrier 300 carries two groups of DUTs 301 being contacted to two rows of (e.g. six, according to FIG. 4) contact socket modules 100-1, 100-2. Referring to FIG. 3B, the DUT sided contact tips 112 contact to the DUTs, and the PCB sided contact tips 113, on the opposite side contact to a PCB (printed circuit board) 504. Further and as an alternative, the ATE may comprise a vacuum source 510 providing vacuum to a vacuum carrier 300' holding the electronic components (DUTs) 301 by vacuum or low pressure. In any of the embodiments the (batch) carrier 300 may, in particular, be a vacuum carrier 300' holding the DUTs 301 even if the vacuum carrier 300' is decoupled from the vacuum source 510.

FIG. 6 shows a flow diagram of a method 600 of testing electronic components using the contact socket module 100. The method comprises providing 601 the batch carrier 300 carrying DUTs 301, and contacting the DUTs 301 to the contact module in the first state 602. After testing 603 of the DUTs 301 the contact socket module 100 is brought into the second state and the DUT sided contact tips 112 are retracted 604 in the second state, respectively. Then removing 605 of the batch carrier 300 carrying the DUTs 301 from the contact socket module 100 may follow, before the retracted DUT sided contact tips 112 are mutually released 606 to be brought from the second state into the first state, where the DUT sided contact tips 112 extend outwards from the cover plate surface 222 of the DUT sided cover plate 122. In the first state of the contact socket module 100 the cycle may restart 607 by providing a (new) batch carrier 300 with DUTs 301 to be tested.

The invention claimed is:

1. A contact socket module for use in an automated test equipment (ATE) for testing electronic components (DUTs) being carried by a carrier comprises:
   a plurality of groups of spring contacts, wherein each spring contact from the plurality of groups of spring contacts comprises a DUT sided contact tip,
   a retracting plate being moveable, and a controller controlling a movement of the retracting plate, wherein the retracting plate acts mechanically on the plurality of groups of spring contacts,
   so that in a test position the retracting plate is in a first position and the DUT sided contact tips are adapted to contact contact portions of the electronic components in the first position of the retracting plate, and the retracting plate is in a second position, when the DUT sided contact tips are adapted so that the contact with the contact portions of the electronic components is released, wherein the controller controls the movement of the retracting plate from the first position into the second position, and back from the second position into the first position.

2. The contact socket module according to claim 1, wherein the contact socket module is adapted so that while the electronic components (DUTs) are in the test position, the controller controls the movement of the retracting plate from the first position into the second position, and/or wherein the contact socket module is adapted to lift off the DUT sided contact tips from the contact portions of the electronic components in the second position of the retracting plate, and/or wherein the retracting plate comprises receiving surfaces, and the spring contacts comprise abutting faces, and the receiving surfaces and the abutting faces interlock with each other, so that, in the first position, the retracting plate lightly pre-loads the plurality of groups of spring contacts, and, in the second position, the retracting plate stronger stresses the plurality of groups of spring contacts.

3. The contact socket module according to claim 1, further comprising:
an elevated abutting face extending opposite to the movement of the retracting plate from the first position into the second position, so that the elevated abutting face limits the movement of the retracting plate from the first position into the second position.

4. The contact socket module according to claim 1, wherein each one of the plurality of groups of spring contacts form a contact site being adapted to contact to one electronic component from the DUTs on the carrier, at a time.

5. The contact socket module according to claim 1, further comprising:
recesses, wherein the DUT sided contact tips are located central within the recesses, wherein the DUT sided contact tips extend into the recesses in the first position of the retracting plate, and wherein the DUT sided contact tips are retracted from the recesses in the second position of the retracting plate.

6. The contact socket module according to claim 1, further comprising:
a pump controlled by the controller, the pump providing air pressure on the retracting plate in its second position.

7. An automated test equipment (ATE), comprising:
a contactor, and
at least two contact socket modules, wherein the at least two contact socket modules are arranged parallel to each other in a main plane of the contactor, so that the at least two contact socket modules are adapted to contact to at least two times of a number of electronic components simultaneously.

8. The automated test equipment (ATE) according to claim 7, further comprises:
a vacuum source for providing vacuum to a carrier, wherein the carrier is adapted to continuously hold the number of electronic components by vacuum suction for a period of time while the vacuum is provided for a shorter period of time.

9. A method of testing electronic components (DUTs) with a contact socket module in an automated test equipment (ATE), wherein the contact socket module comprises
a plurality of groups of spring contacts, wherein each spring contact from the plurality of groups of spring contacts comprises at least one DUT sided contact tip,
a retracting plate being moveable, wherein the retracting plate acts mechanically on the plurality of groups of spring contacts, and a controller, the method comprising:
controlling a movement of the retracting plate by the controller, wherein the controller controls the movement of the retracting plate from a first position into a second position, and back from the second position into the first position,
testing the electronic components (DUTs) when the retracting plate is in the first position where the at least one DUT sided contact tips are adapted to contact contact portions of the electronic components, wherein controlling the movement of the retracting plate into the second position, when the at least one DUT sided contact tips are adapted to releasing the contact with the contact portions of the electronic components.

10. The method according to claim 9 further comprising:
controlling the movement of the retracting plate by the controller from the first position into the second position, while the electronic components (DUTs) are in a test position.

11. The method according to claim 9 further comprising:
lifting off the at least one DUT sided contact tips from the contact portions of the electronic components in the second position of the retracting plate.

12. The method according to claim 9, wherein the retracting plate comprises receiving surfaces, and the plurality of groups of spring contacts comprise abutting faces, wherein the receiving surfaces and the abutting faces interlock with each other, and wherein the method further comprises:
lightly pre-loading the spring contacts in the first position of the retracting plate, and,
stronger stressing the plurality of groups of spring contacts in the second position of the retracting plate.

13. The method according to claim 9, wherein the contact socket module further comprises an elevated abutting face extending opposite to the movement of the retracting plate from the first position into the second position, and wherein the method further comprises:
limiting the movement of the retracting plate from the first position into the second position by the elevated abutting face.

14. The method according to claim 9, further comprising:
forming a contact site with each one of the plurality of groups of spring contacts, and
contacting with one contact site to one electronic component from the DUTs on a carrier, at a time.

15. The method according to claim 9, wherein the contact socket module further comprising recesses, wherein the DUT sided contact tips are located central within the recesses, and wherein the method further comprises:
letting extend the DUT sided contact tips into the recesses in the first position of the retracting plate, and wherein
retracting the DUT sided contact tips from the recesses when moving the retracting plate into the second position.

16. The method according to claim 9, wherein the contact socket module further comprises a pump, and wherein the method further comprises:
controlling the movement of the retracting plate by providing air pressure from the pump.

17. The method according to claim 9, wherein the automated test equipment (ATE) comprises a contactor and at least two contact socket modules, wherein the at least two contact socket modules are arranged parallel to each other in a main plane of the contactor, and wherein the method further comprises:
simultaneously contacting the at least two contact socket modules to at least two times of a number of electronic components.

18. The method according to claim 9, wherein the automated test equipment (ATE) comprises a vacuum source, and wherein the method further comprises:
continuously holding the electronic components by vacuum suction for a period of time by providing vacuum to a carrier for a shorter period time.

\* \* \* \* \*